United States Patent
Ho et al.

(10) Patent No.: US 7,098,071 B2
(45) Date of Patent: Aug. 29, 2006

(54) METHOD FOR FLIP CHIP BONDING BY UTILIZING AN INTERPOSER WITH EMBEDDED BUMPS

(75) Inventors: Ming-Lun Ho, Kaohsiung (TW); Chih-Ming Chung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/136,181

(22) Filed: May 24, 2005

(65) Prior Publication Data

US 2006/0088953 A1    Apr. 27, 2006

(30) Foreign Application Priority Data

Oct. 21, 2004    (TW) .............................. 93132044 A

(51) Int. Cl.
*H01L 21/44* (2006.01)
(52) U.S. Cl. .................................. 438/106; 438/107
(58) Field of Classification Search ................ 438/15, 438/22–27, 33, 42, 106–111, 118, 119, 121, 438/123–127, 455, 456, 460, 481
See application file for complete search history.

(56) References Cited

U.S. PATENT DOCUMENTS

| 6,190,940 | B1* | 2/2001 | DeFelice et al. ............ 438/106 |
| 6,297,560 | B1 | 10/2001 | Capote et al. |
| 6,566,234 | B1 | 5/2003 | Capote et al. |
| 6,689,639 | B1* | 2/2004 | Sakuyama et al. ........... 438/118 |
| 6,716,665 | B1* | 4/2004 | Baba et al. ................. 438/106 |
| 6,897,090 | B1* | 5/2005 | DiStefano et al. .......... 438/106 |
| 2002/0042164 | A1* | 4/2002 | Funaya et al. .............. 438/125 |
| 2004/0197979 | A1* | 10/2004 | Jeong et al. ................ 438/202 |

* cited by examiner

*Primary Examiner*—Michael Lebentritt
*Assistant Examiner*—Andre' C. Stevenson
(74) *Attorney, Agent, or Firm*—Ladas & Parry LLP

(57) ABSTRACT

The present invention relates to a method for flip chip bonding by utilizing an interposer with embedded bumps. The method comprises (a) providing a first element having a first surface; (b) forming an interposer onto the first surface; (c) forming a plurality of openings on the interposer; (d) forming a plurality of bumps in the openings, wherein the height of the bumps is smaller than the depth of the openings; (e) providing a second element having a plurality of pre-solders; and (f) bonding the first surface onto the second element, so that the pre-solders are disposed in the openings and in contact with the bumps. As a result, the self-alignment between the pre-solders and the bumps can avoid the shift between the first element and the second element.

16 Claims, 3 Drawing Sheets

# METHOD FOR FLIP CHIP BONDING BY UTILIZING AN INTERPOSER WITH EMBEDDED BUMPS

BACKGROUND OF THE INVENTION

1. Field of the Invention

The present invention relates to a method for flip chip bonding, and more particularly, to a method for flip chip bonding by utilizing an interposer with embedded bumps.

2. Description of the Related Art

FIG. 1 shows a conventional method for flip chip bonding by utilizing an underfill tape with embedded bumps. The conventional method is described as follows. First, a chip 10 having a chip surface 11 is provided. Then, an underfill tape 12 is adhered to the chip surface 11. Then, a plurality of openings 13 are formed on the underfill tape 12 by laser drilling. Then, a plurality of bumps 14 are formed in the opening 13 by plating, wherein the composition of the bumps 14 is 63% by weight of tin and 37% by weight of lead, and the height of the bump 14 is equal to the depth of the opening 13 so that the bump 14 can fill the opening 13 precisely.

Then, a substrate 15 having a substrate surface 16 is provided, wherein the substrate surface 16 has a plurality of pre-solders 17 corresponding to the openings 13. The chip 10 is pressed to the substrate 15 by utilizing a bond head 18, wherein the chip surface 11 faces the substrate surface 16 so that the pre-solders 17 are in contact with the bumps 14. Finally, a reflow step with high temperature (for example, above 200° C.) and high pressure (for example, about 30 Kgm) is applied to the chip 10 and the substrate 15 to fuse the pre-solders 17 and the bumps 14 so as to form a flip chip bonding.

The shortcoming of the conventional method is poor alignment precision. Because the bumps 14 fill the openings 13 precisely, the bottom surface 19 of the underfill tape 12, which is in contact with the pre-solders 17, is a flat surface. Therefore, during the pressing procedure, a sliding movement between the chip 10 and the substrate 15 will cause a shift therebetween, which makes the product defective.

Consequently, there is an existing need for a novel and improved method for flip chip bonding to solve the above-mentioned problem.

SUMMARY OF THE INVENTION

One objective of the present invention is to provide a method for flip chip bonding by applying an interposer (such as underfill tape or B-stage material) with embedded bumps to a chip, wherein the bumps do not fill the openings of the interposer completely so as to form a plurality of recessions. When the chip is pressed to a substrate, the pre-solders of the substrate can fill the recessions. As a result, the self-alignment between the bumps and pre-solders in the openings can avoid the sliding movement between the chip and the substrate.

Another objective of the present invention is to provide a method for flip chip bonding by utilizing an interposer with embedded bumps, comprising:

(a) providing a first element having a first surface;

(b) forming a interposer onto the first surface;

(c) forming a plurality of openings on the interposer;

(d) forming a plurality of bumps in the openings, wherein the height of the bumps is smaller than the depth of the openings;

(e) providing a second element having a plurality of pre-solders; and (f) bonding the first element and the second element, so that the pre-solders is disposed in the openings and in contact with the bumps.

DETAILED DESCRIPTION OF THE INVENTION

FIGS. 2 to 6 show a method for flip chip bonding by utilizing an interposer with embedded bumps according to the preferred embodiment of the present invention. The method is described as follows. First, a first element, such as a chip 20, is provided. The chip 20 has a first surface 21. Then, an interposer, such as an underfill tape 22, is adhered to the first surface 21. Then, a plurality of openings 23 are formed on the underfill tape 22 so as to expose the pads (not shown) of the chip 20. The openings 23 may be formed by any conventional method, such as laser drilling, and exposing and developing.

Figure 1:
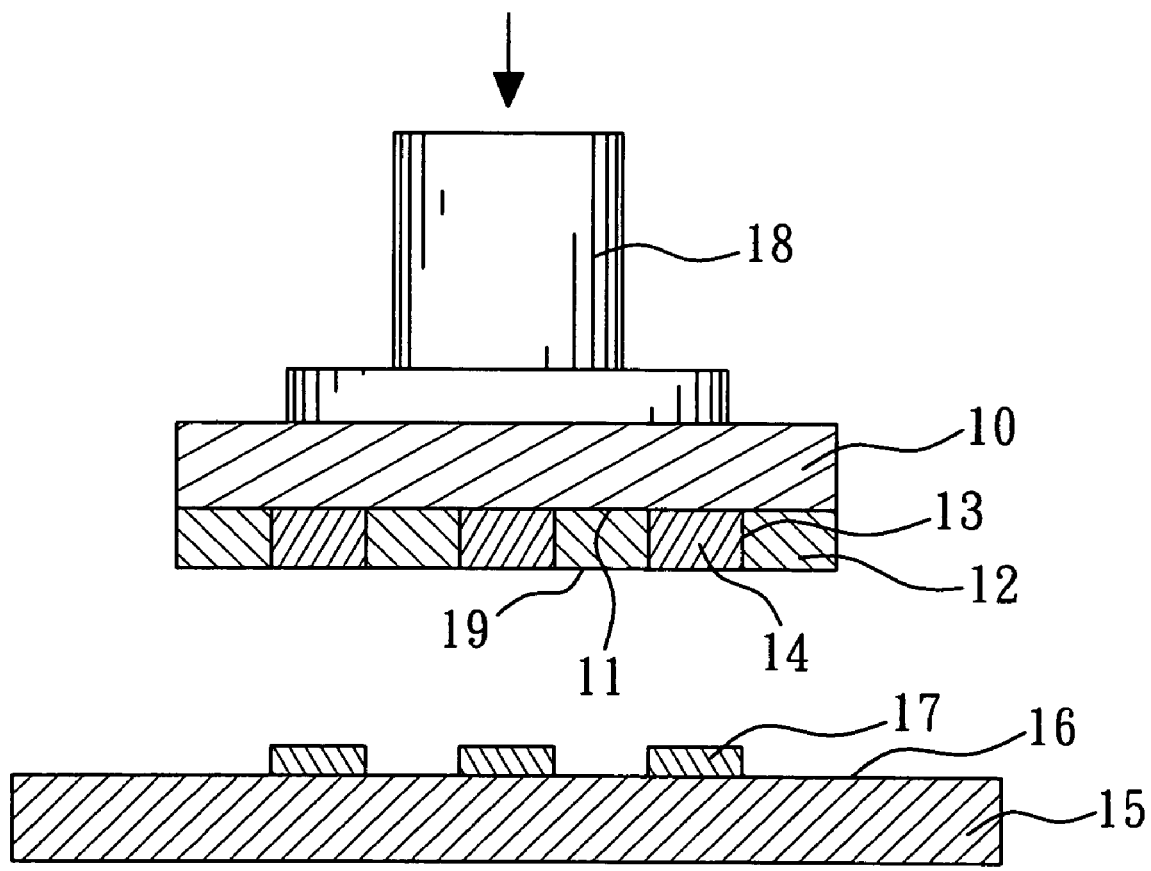
FIG. 1 shows a conventional method for flip chip bonding by utilizing an underfill tape with embedded bumps.
Figure 2:
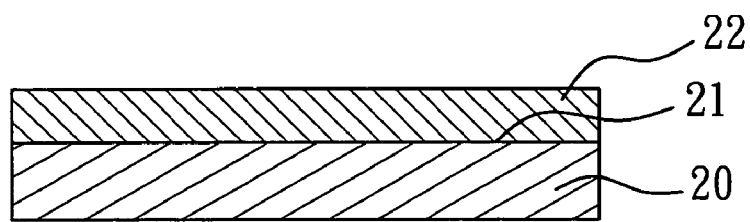
FIGS. 2 to 6 show a method for flip chip bonding by utilizing an interposer with embedded bumps according to the preferred embodiment of the present invention.
Figure 3:
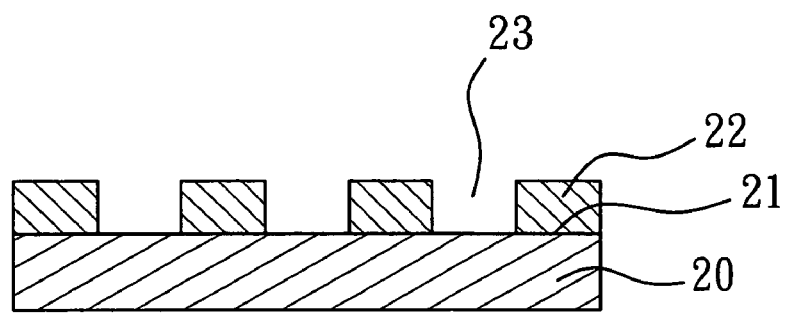
Figure 4:
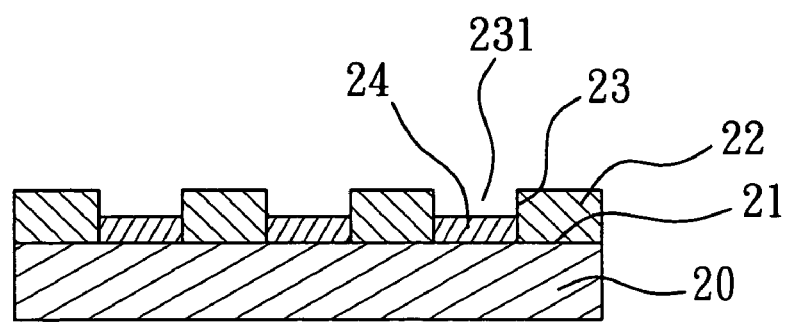

Then, referring to FIG. 4, a plurality of bumps 24 are formed in the opening 23 by plating. The composition of the bumps 24 is 63% by weight of tin and 37% by weight of lead, or 5% by weight of tin and 95% by weight of lead. Alternatively, the bumps 24 may be gold bumps or copper bumps. The height of the bumps 24 is smaller than the depth of the openings 23 so as to form a plurality of recessions 231. That is, the bumps 24 do not fill the openings 23 completely.

Figure 5:
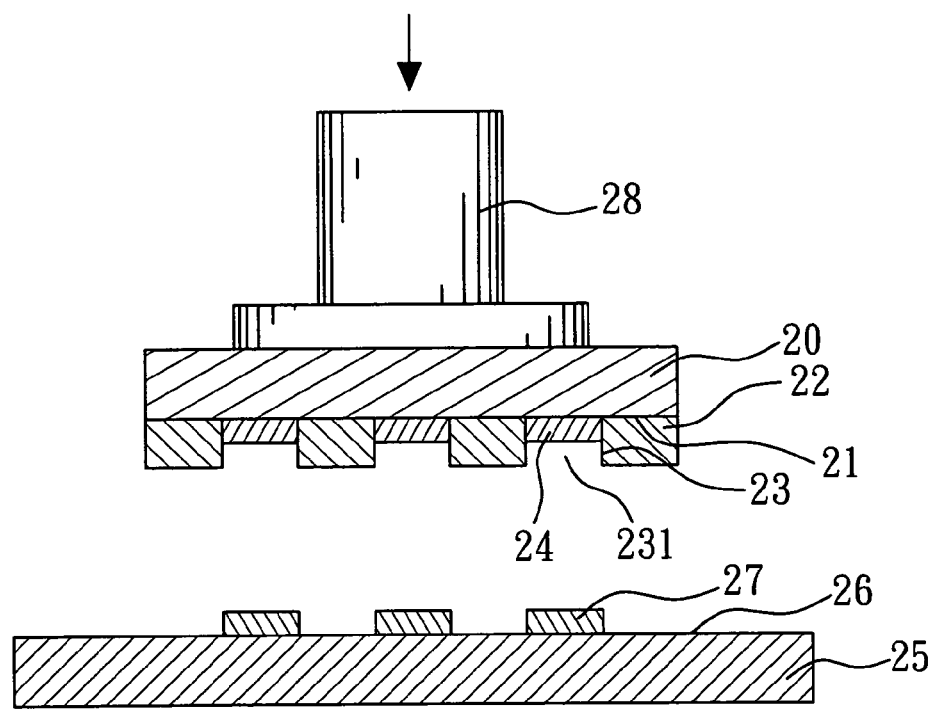

Then, referring to FIG. 5, a second element, such as a substrate 25, is provided. The substrate 25 has a second surface 26 on which a plurality of pre-solders 27 are disposed. The position of the pre-solders 27 corresponds to that of the openings 23. The height of the pre-solders 27 is equal to or larger than the depth of the recessions 231 (the difference between the depth of the openings 23 and the height of the bumps 24) so that the pre-solders 27 can fill the recessions 231 completely.

The chip 20 is bonded to the substrate 25 by utilizing a bond head 28, wherein the first surface 21 faces the second surface 26 so that the pre-solders 27 are accommodated in the openings 23 and are in contact with the bumps 24. In the embodiment, the chip 20 is pressed onto the substrate 25. Alternatively, the substrate 25 is pressed onto the chip 20.

Figure 6:
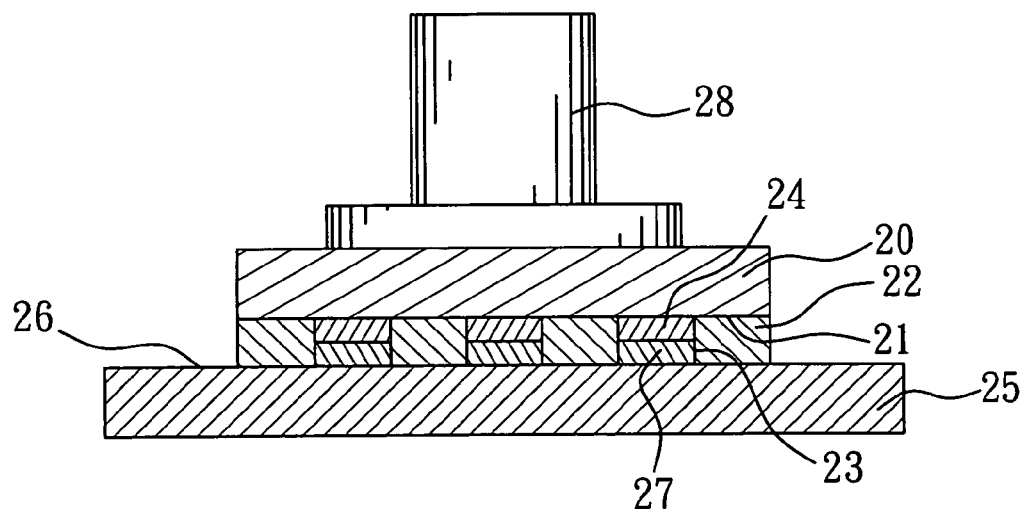

Finally, a reflow step with high temperature (for example, above 200° C.) and high pressure (for example, about 30 Kgm) is applied to the chip 20 and the substrate 25 for about twenty minutes so that the underfill tape 22 can fill the gap between the chip 20 and the substrate 25, and the pre-solders 27 and the bumps 24 are fused to form a flip chip bonding, as shown in FIG. 6.

In the embodiment, the first element is a chip and the second element is a substrate. However, it is understood that the first element may be a substrate, the second element is a chip, and the underfill tape is adhered to the substrate. Additionally, in another embodiment, the first element is a substrate, the second element is a wafer, and the underfill tape is adhered to the substrate. A plurality of pre-solders are formed on the wafer that is then sliced into a plurality of dice. Finally, the dice are mounted onto the substrate.

In the embodiment, the interposer is an underfill tape. However, it is understood that the interposer may be a B-stage material, which is a semi-solid adhesive. The B-stage material is coated on the first surface of the first element, then is heated to become semi-solid, and then to proceed the above-mentioned process of forming openings, plating bumps, pressing and reflow. It should be noted that during the reflow process, the B-stage material will become a plastic adhesive and fill the gap between the first element and the second element. Therefore, the B-stage material needs to be maintained at a certain temperature (for example 175° C.) for a certain length of time (for example thirty minutes) to become fully hardened.

According to the present invention, the self-alignment between the bumps 24 and the pre-solders 27 in the openings 23 can avoid the sliding movement between the first element and the second element.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A method for flip chip bonding by utilizing an interposer with embedded bumps, comprising:
   (a) providing a first element having a first surface;
   (b) forming an interposer onto the first surface;
   (c) forming a plurality of openings having depths on the interposer;
   (d) forming a plurality of bumps in the openings, wherein the heights of the bumps are smaller than the depths of the openings;
   (e) providing a second element having a plurality of pre-solders; and
   (f) bonding the first element and the second element, so that the pre-solders are disposed in the openings and in contact with the bumps,
   wherein the heights of the pre-solders are equal to or larger than the difference between the depths of the openings and the heights of the bumps.

2. The method according to claim 1, wherein the first element is a chip and the second element is a substrate.

3. The method according to claim 1, wherein the first element is a substrate and the second element is a chip.

4. The method according to claim 1, wherein the first element is a substrate and the second element is a wafer, the method further comprises a step of cutting the wafer to form a plurality of dice after step (e), and the step (f) is mounting the dice onto the substrate.

5. The method according to claim 1, wherein the step (f) is pressing the first element onto the second element.

6. The method according to claim 1, wherein the step (f) is pressing the second element onto the first element.

7. The method according to claim 1, wherein the interposer is an underfill tape.

8. The method according to claim 1, wherein the interposer is a B-stage material.

9. The method according to claim 1, wherein the interposer of the step (b) is adhered to the first surface.

10. The method according to claim 1, wherein the interposer of the step (b) is coated to the first surface.

11. The method according to claim 1, wherein the openings of the step (c) are formed by laser drilling.

12. The method according to claim 1, wherein the openings of the step (c) are formed by exposing and developing.

13. The method according to claim 1, further comprising a reflow step after the step (f) so as to fuse the pre-solders and the bumps.

14. The method according to claim 1, wherein the composition of the bumps is 63% by weight of tin and 37% by weight of lead.

15. The method according to claim 1, wherein the composition of the bumps is 5% by weight of tin and 95% by weight of lead.

16. The method according to claim 1, wherein the bumps are gold bumps.

* * * * *